(12) United States Patent
Lee et al.

(10) Patent No.: US 12,183,779 B2
(45) Date of Patent: Dec. 31, 2024

(54) INTEGRATED CIRCUIT AND METHOD OF FORMING THE SAME

(71) Applicant: Taiwan Semiconductor Manufacturing Company, Ltd., Hsinchu (TW)

(72) Inventors: Ming-Che Lee, Tainan (TW); Sheng-Chau Chen, Tainan (TW); Cheng-Yuan Tsai, Hsin-Chu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 559 days.

(21) Appl. No.: 17/462,016

(22) Filed: Aug. 31, 2021

(65) Prior Publication Data
US 2023/0067249 A1    Mar. 2, 2023

(51) Int. Cl.
*H01L 21/768*    (2006.01)
*H01L 23/522*    (2006.01)
*H01L 49/02*    (2006.01)

(52) U.S. Cl.
CPC ........ *H01L 28/91* (2013.01); *H01L 21/76832* (2013.01); *H01L 21/76877* (2013.01); *H01L 23/5223* (2013.01); *H01L 23/5226* (2013.01)

(58) Field of Classification Search
CPC ............... H01L 28/91; H01L 21/76832; H01L 21/76877
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2003/0234416 A1 | 12/2003 | Thomas et al. |
| 2006/0154436 A1 | 7/2006 | Kim et al. |
| 2016/0379871 A1* | 12/2016 | Tsai .................. H01L 21/76877 257/774 |
| 2020/0395435 A1 | 12/2020 | Haratipour et al. |

OTHER PUBLICATIONS

"Office Action of Taiwan Counterpart Application", issued on Jul. 14, 2022, p. 1-p. 4.

* cited by examiner

*Primary Examiner* — Anthony Ho
(74) *Attorney, Agent, or Firm* — JCIPRNET

(57) ABSTRACT

Provided are an integrated circuit (IC) and a method of forming the same. The IC includes a substrate; a conductive layer, disposed on the substrate; a barrier layer, disposed on the conductive layer; an etching stop layer, covering a sidewall of the barrier layer and extending on a first portion of a top surface of the barrier layer; and at least one capacitor structure, disposed on a second portion of the top surface of the barrier layer.

20 Claims, 15 Drawing Sheets

INTEGRATED CIRCUIT AND METHOD OF FORMING THE SAME

BACKGROUND

Many modern electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors (CISs). Compared to CCD image sensors, CISs are favored due to, among other things, low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
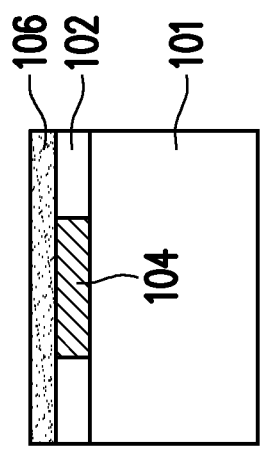
FIG. 1A to FIG. 1F are cross-sectional views of a method of forming an integrated circuit (IC) having a capacitor structure in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide semiconductor image sensors (CISs) have an array of pixel sensors. A pixel sensor of the array of pixel sensors includes an array of photodetectors (e.g., a 2×2 photodetector array) disposed in a substrate and a plurality of pixel devices (e.g., transfer transistors, source-follower transistors, reset transistors, row-select transistors, etc.). For CIS, such as global shutter image sensor, MIM (metal-insulator-metal) capacitors with high capacitance are needed. MIM capacitors typically include a capacitor dielectric layer disposed between an upper conductive electrode and a lower conductive electrode. The upper conductive electrode and the lower conductive electrode are often disposed within an intermetal dielectric (IMD) layer on a back-end-of-the-line (BEOL) of an integrated circuit (IC). MIM capacitors may, for example, be electrically coupled to the pixel sensors (e.g., to one or more of the pixel devices). In such embodiments, the trench capacitors may be used as decoupling capacitors for the pixel sensor. In some embodiments, the decoupling capacitors may be widely used in various circuits. For example, a decoupling capacitor is a capacitor configured to decouple one part of an electrical circuit from another, thereby reducing the noise and the coupling interference.

To achieve a sufficiently high capacitance for IC applications, MIM capacitors often consume a relatively large area of an IC. However, as the minimum feature sizes of ICs (e.g., gate sizes, metal interconnect sizes, etc.) continue to decrease, the process of manufacturing the MIM capacitors has to face some challenges, such as the barrier layer (e.g., TaN) overhang issue due to the deep trench with narrow critical dimension. Specifically, the barrier layer formed by physical vapor deposition (PVD) may overhang on the top of the deep trench. In this case, the MIM capacitor may not be able to fully fill in the deep trench due to the block of the barrier layer overhang, thereby affecting the capacitance of the MIM capacitor. Even if the barrier layer with better coverage is formed by atomic layer deposition (ALD), the wafer per hour (WPH) of the ALD barrier layer is slower and the cost of the ALD barrier layer is higher. Further, the resistance of the ALD barrier layer is higher than the resistance of the PVD barrier layer, thereby affect the performance of the IC.

In accordance with some embodiments, the barrier layer is formed first, the capacitor trench is then formed to expose a portion of the barrier layer. In this case, the barrier layer is disposed directly below the capacitor trench to make more trench space for accommodating the MIM capacitor, thereby increasing the capacitance of the MIM capacitor. In addition, the overhang issue is also solved by forming the barrier layer outside the capacitor trench. Further, the PVD barrier layer has a lower resistance than the ALD barrier layer to decrease Resistive-Capacitive (RC) delay, thereby enhancing the performance of the IC.

FIG. 1A to FIG. 1F are cross-sectional views of a method of forming an integrated circuit (IC) having a capacitor structure in accordance with a first embodiment.

Figure 1A:
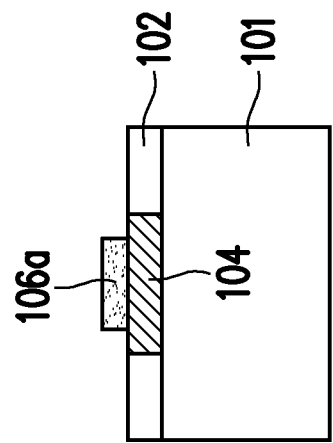

Referring to FIG. 1A, a substrate 101 is provided. In some embodiments, the substrate 101 may be a semiconductor substrate, such as a bulk semiconductor, a semiconductor-on-insulator (SOI) substrate, or the like, which may be doped (e.g., with a p-type or an n-type dopant) or undoped. Generally, the SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. For example, the substrate 101 is a wafer, such as a silicon wafer. The substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Alternatively, a plurality of electrical components, such as photodetectors, transistors, resistors, capacitors, inductors, diodes, or the like, may formed in a device region of the substrate 101 in the front-end-of-line (FEOL) processing of semiconductor manufacturing. In some embodiments, the electrical components may be formed in/on the substrate 101 using any suitable formation method known or used in semiconductor manufacturing.

A dielectric layer 102 is formed on the substrate 101. In some embodiments, the dielectric layer 102 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 102 includes low-k dielectric materials that have a dielectric constant less than 4. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the dielectric layer 102 include one or more dielectric materials. In some embodiments, the dielectric layer 102 is formed by any suitable method, such as chemical vapor deposition (CVD), spin-on, or the like.

A conductive layer 104 is formed in the dielectric layer 102. In some embodiments, the conductive layer 104 may be a conductive line, a conductive circuit, or the like, so as to electrically connect the electrical components in/on the substrate 101. The conductive layer 104 may include a seed layer and a metal layer on the seed layer. The seed layer may be a conformal layer lining the sidewalls and the bottom surface of the metal layer. In some embodiments, the seed layer may be a single layer or a composite layer including a plurality of sub-layers formed of different materials. For example, the seed layer is a titanium/copper composited layer. The metal layer may include a metal material, such as Al, Cu, W, Co, Pd, Pt, Ni, other low resistivity metal constituent, an alloy thereof, or a combination thereof, and are formed by an electroplating process. In addition, a barrier layer may be formed between the conductive layer 104 and the dielectric layer 102 to separate the conductive layer 104 from the dielectric layer 102 and prevent the metal atoms (e.g., Cu, Co, W, or Al atoms) of the conductive layer 104 from diffusing into the dielectric layer 102. The barrier layer may include Ti, TiN, Ta, TaN, an alloy thereof, or a combination thereof. In some embodiments, the barrier layer and the conductive layer 104 are formed by a single damascene process, which includes performing a lithography and etching process to form a trench in the dielectric layer 102, lining the trench with a barrier material, filling the trench with a conductive material, and performing a planarization process to remove excess the conductive and barrier materials, so that the barrier layer, the conductive layer 104, and the dielectric layer 102 have substantially planar surfaces.

After forming the conductive layer 104, a barrier material 106 is formed on the dielectric layer 102 and the conductive layer 104. As shown in FIG. 1A, the barrier material 106 covers a top surface of the dielectric layer 102 and a top surface of the conductive layer 104. In some embodiments, the barrier material 106 includes Ti, TiN, Ta, TaN, an alloy thereof, or a combination thereof, and is formed by PVD, such as sputter. Alternatively, the barrier material 106 may be formed by ALD.

Referring to FIG. 1B, the barrier material 106 is patterned to form a barrier layer 106a on the conductive layer 104. Although a width of the barrier layer 106a illustrated in FIG. 1B is less than a width of the underlying conductive layer 104, the embodiments of the present disclosure are not limited thereto. In some alternative embodiments, the width of the barrier layer 106a may be substantially equal to the width of the underlying conductive layer 104.

Figure 1C:
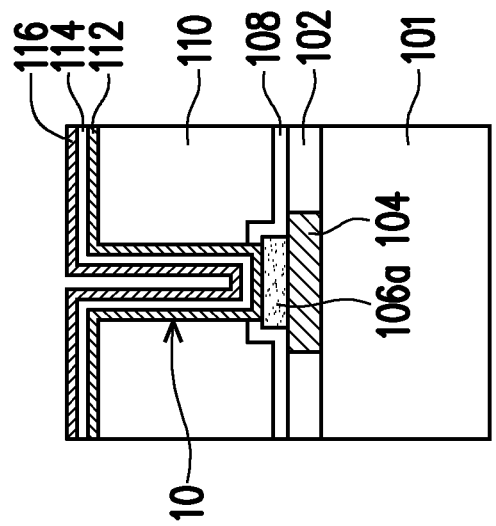

Referring to FIG. 1C, after forming the barrier layer 106a, an etching stop layer 108 is formed to conformally cover the top surface of the first dielectric layer 102, a portion of the top surface of the conductive layer 104, a sidewall and a top surface of the barrier layer 106a. In some embodiments, the etching stop layer 108 includes silicon carbide, silicon nitride, or the like.

Thereafter, a dielectric layer 110 is formed on the etching stop layer 108. In some embodiments, the dielectric layer 110 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 110 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the dielectric layer 110 include one or more dielectric materials. In some embodiments, the dielectric layer 110 is formed by any suitable method, such as chemical vapor deposition (CVD), spin-on, or the like. In the embodiment, the dielectric layer 110 and the etching stop layer 108 have different materials. For example, the etching stop layer 108 may be a silicon carbide layer, and the dielectric layer 110 may be a silicon oxide layer.

An etching process is performed to remove a portion of the dielectric layer 110 and a portion of the etching stop layer 108, thereby forming a trench 10 in the dielectric layer 110 and the etching stop layer 108. As shown in FIG. 1C, the trench 10 exposes a second portion of the top surface 106t2 of the barrier layer 106a, while the etching stop layer 108 covers a first portion of the top surface 106t1 of the barrier layer 106a. In some embodiments, the etching process includes a dry etching process, such as a reactive ion etching (RIE) process. The etching stop layer 108 and the dielectric layer 110 may have different etching selectivities. In the case, the etching stop layer 108 may be prevent the underlying barrier layer 106a from damage caused by the over-etching in the etching process. In some embodiments, the trench 10 has a width 10w and a height 10h, the width 10w of the trench 10 may be 0.1 μm to 0.2 μm, such as 0.16 μm; the height 10h of the trench 10 may be 1.0 μm to 2.0 μm, such as 1.65 μm; and an aspect ratio of the trench 10 (i.e., 10h/10w) may be 5 to 20, such as 10.31. However, the embodiments of the present disclosure are not limited thereto. In other embodiments, the aspect ratio of the trench 10 may be greater than 5 to achieve higher capacitance for the IC.

Figure 1D:
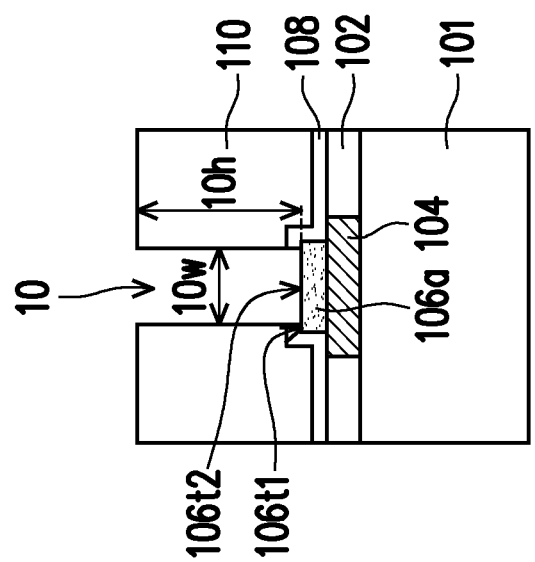

Referring to FIG. 1D, a lower electrode material 112 is formed on the barrier layer 106a to overlay the dielectric layer 110 and line a surface of the trench 10. In some embodiments, the lower electrode material 112 includes a conductive material, such as tantalum, tantalum nitride, titanium, titanium nitride, or the like, and may be formed by CVD, PVD, or the like. In some embodiments, the lower electrode material 112 may have a thickness within a range of about 10 nm to 50 nm.

A capacitor dielectric material 114 is then formed on the lower electrode material 112 and lining the surface of the trench 10. In some embodiments, the capacitor dielectric material 114 includes a high-k dielectric material that have a dielectric constant greater than 4, some other suitable dielectric(s), or any combination of the foregoing. The high-k dielectric material may, for example, be or include hafnium oxide, zirconium oxide, aluminum oxide, tantalum oxide, titanium oxide, or some other suitable high-k dielectric(s), or any combination of the foregoing. In some embodiments, the capacitor dielectric material 114 may have a thickness within a range of about 2 nm to 10 nm.

Thereafter, an upper electrode material 116 is formed on the capacitor dielectric material 114 and lining the surface of the trench 10. In some embodiments, the upper electrode material 116 includes a conductive material, such as tantalum, tantalum nitride, titanium, titanium nitride, or the like, and may be formed by CVD, PVD, or the like. In some embodiments, the upper electrode material 116 may have a thickness within a range of about 10 nm to 50 nm. The upper electrode material 116 and the lower electrode material 112 may have the same material or different materials.

Figure 1F:
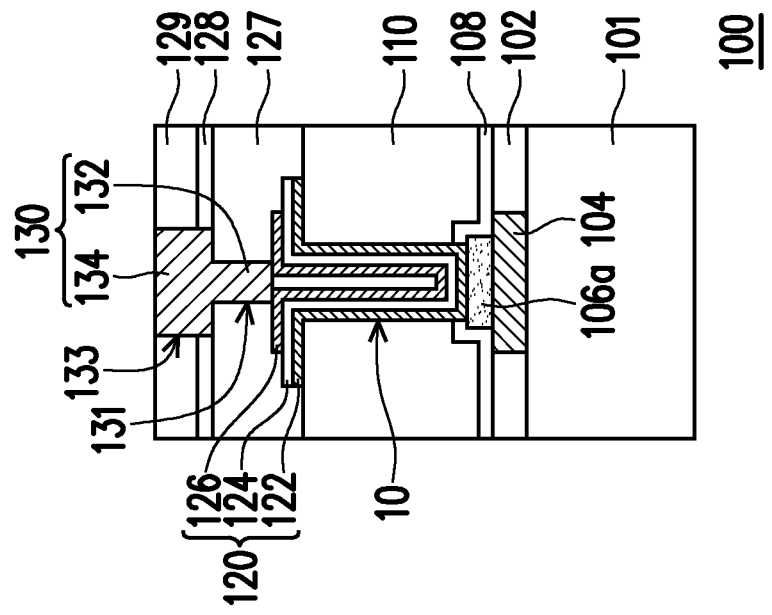
Figure 1E:
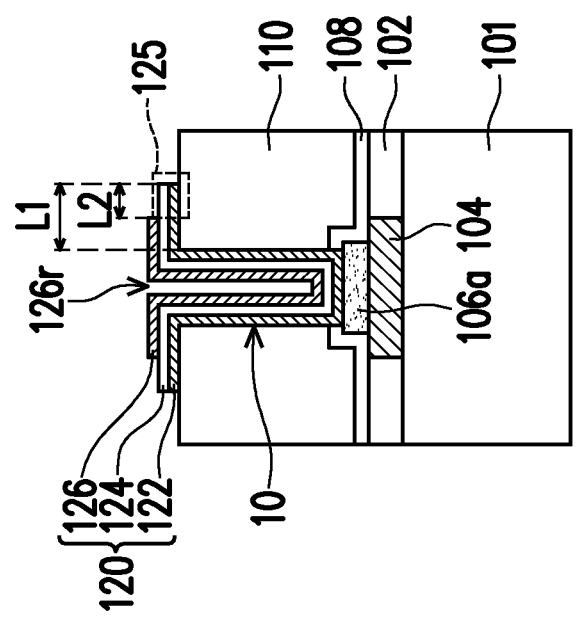

Referring to FIG. 1E, the upper electrode material 116 is patterned until exposing the surface of the capacitor dielectric material 114, thereby forming an upper electrode 126. Next, a photoresist pattern is formed to cover the upper electrode 126 and a portion of the capacitor dielectric material 114 and the lower electrode material 112 uncovered by the upper electrode 126. Thereafter, by using the photoresist pattern as a mask, the capacitor dielectric material 114 and the lower electrode material 112 are patterned to expose the top surface of the dielectric layer 110, thereby forming a capacitor structure 120. In some embodiments, the capacitor structure 120 includes a lower electrode 122, a capacitor dielectric layer 124, and the upper electrode 126. The lower electrode 122 lining the surface of the trench 10 has a U-shaped profile within the trench 10. The upper electrode 126 is disposed over the lower electrode 122. The capacitor dielectric layer 124 is disposed between the lower electrode 122 and the upper electrode 126 to separate the lower electrode 122 from the upper electrode 126. In the embodiment, the lower electrode 122 and the capacitor dielectric layer 124 have an extending portion 125 protruding the sidewall of the upper electrode 126. In other words, the capacitor dielectric layer 124 and the lower electrode 122 have a length L1 extending on the dielectric layer 110, the upper electrode 126 has a length L2 extending on the dielectric layer 110, and the length L1 is greater than the length L2.

In some embodiment, the upper electrode 126 may be a conformal layer lining the surface of the trench 10, and a recess 126r may be formed on the top surface of the upper electrode 126 within the trench 10. In some alternative embodiments, if the width 10w of the trench 10 is wide enough, more layers may be accommodated within the trench 10. For example, the capacitor structure 120 may include five layers (i.e., MIMIM), seven layers (i.e., MIMIMIM), or more layers to increase the capacitance of the capacitor structure 120. In some other embodiments, if the width 10w of the trench 10 is narrow, the upper electrode 126 may be fully filled in the trench 10 and formed as a T-shaped profile.

It should be noted that, in the present embodiment, the barrier layer 106a is formed, the trench 10 is then formed directly on the barrier layer 106a for accommodating the capacitor structure 120. In this case, the barrier layer 106a is formed outside the trench 10 to make more trench space for accommodating the capacitor structure 120, thereby increasing the capacitance of the capacitor structure 120 and solving the barrier overhang issue. Further, the barrier layer 106a may be formed by PVD to decrease the resistance of barrier layer 106a and enhance the wafer per hour (WPH) of the barrier layer 106a.

Referring to FIG. 1F, a dielectric layer 127, an etching stop layer 128, and a dielectric layer 129 are formed on the dielectric layer 110 in order. The dielectric layer 127 may cover the top surface of the dielectric layer 110, overlay the capacitor structure 120, and fill in the recess 126r (as shown in FIG. 1E). The etching stop layer 128 is disposed between the dielectric layers 127 and 128. In some embodiments, the dielectric layers 127 and 128 include silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 110 includes low-k dielectric materials. In some embodiments, the etching stop layer 128 includes silicon carbide, silicon nitride, or the like. In the embodiment, the dielectric layers 127 and 128 have the same dielectric material, and the dielectric layers 127 and 128 have different dielectric material from the etching stop layer 128. For example, the dielectric layers 127 and 128 are silicon oxide layers, and the etching stop layer 128 is a silicon nitride layer.

After forming the dielectric layer 129, a conductive feature 130 is formed in the dielectric layer 127, the etching stop layer 128, and the dielectric layer 129 to connect the upper electrode 126 of the capacitor structure 120, thereby accomplishing an integrated circuit (IC) 100. As shown in FIG. 1F, the conductive feature 130 may include a conductive via 132 and a conductive line 134 on the conductive via 132. In some embodiments, the conductive feature 130 is formed by a dual damascene method, such as a trench first process. Specifically, the dielectric layer 129 is patterned by lithography and etching processes to form a trench 133 therein. The trench 133 may correspond to the capacitor structure 120. During the etching process, the trench 133 stops on the etching stop layer 128, and a portion of the etching stop layer 128 is exposed by the trench 133. Next, the portion of the etching stop layer 128 exposed by the trench 133 and the underlying dielectric layer 127 are patterned by lithography and etching processes to form via hole 131 therein. The via holes 131 exposes the upper electrode 126 of the capacitor structure 120. Thereafter, a conductive material is formed on the dielectric layer 129, and fills into the trench 133 and the via hole 131. The excess conductive material on the dielectric layer 129 is then removed by a planarization process, such as a CMP process, and thus the conductive line 134 is formed in the trench 133, and the conductive via (or plug) 124 is formed in the via hole 131 respectively. Alternatively, the conductive feature 130 may be formed by a via hole first process, a self-aligned process, or the like.

In some embodiments, the conductive feature 130 includes a seed layer and a metal layer on the seed layer. The seed layer may be a conformal layer lining the sidewalls and the bottom surface of the metal layer. In addition, a barrier layer is further formed before forming the conductive feature 130, so that the barrier layer conformally covers a surface of the trench 133 and a surface of the via hole 131, and disposed between the seed layer and the layers 127, 128, and 129. The barrier layer is able to prevent the metal atoms (e.g., Cu, Co, W, or Al atoms) of the conductive feature 130 from diffusing into the dielectric layers 127 and 129.

Figure 2:
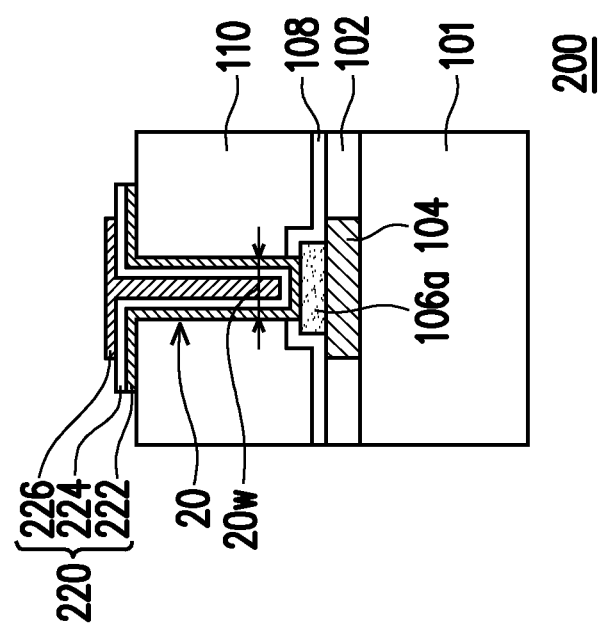
FIG. 2 is a cross-sectional view of an integrated circuit (IC) having a capacitor structure in accordance with a second embodiment.

FIG. 2 is a cross-sectional view of an integrated circuit (IC) 200 having a capacitor structure 220 in accordance with a second embodiment.

Referring to FIG. 2, the IC 200 is similar to the IC 100 of FIG. 1F, but an upper electrode 226 is fully filled in the trench 20 and formed as a T-shaped profile. In some embodiment, the trench 20 has a width 20w less than the width 10w of the trench 10 illustrated in FIG. 1C. In this case, the conformal upper electrode 226 lining on the surface of the trench 20 may connect to each other, thereby forming the T-shaped profile. That is, the capacitor structure 220 may include a lower electrode 222 with a U-shaped within the trench 20, the upper electrode 226 with the T-shaped profile, and a capacitor dielectric layer 224 between the lower electrode 222 and the upper electrode 226. The configuration, material, and function of the IC 200 is similar to those of the IC 100 and have been described in the above embodiment, thus the details are omitted herein.

Figure 3A:
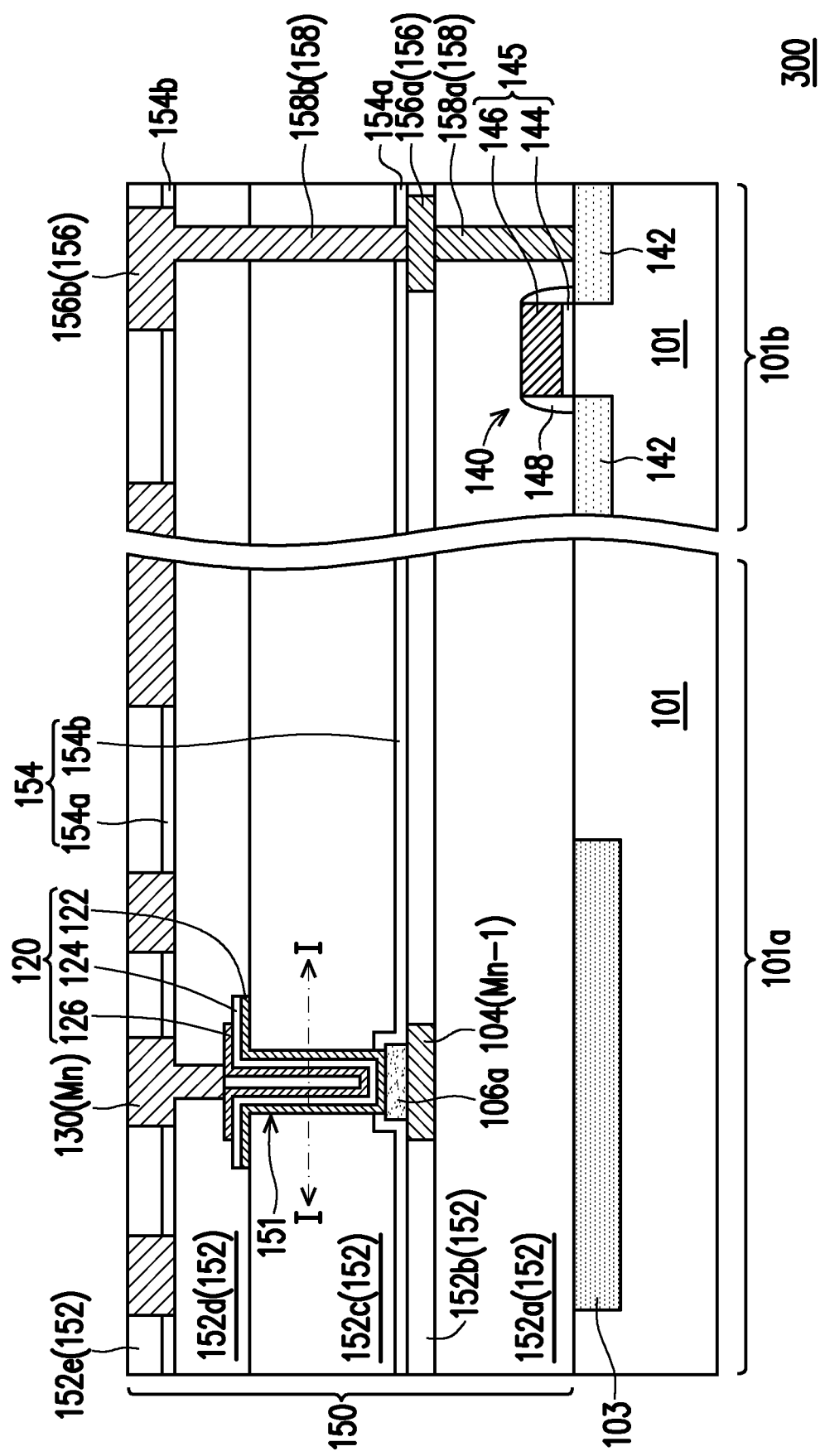
FIG. 3A is a cross-sectional view of an integrated circuit (IC) having a capacitor structure overlying a photodetector in accordance with a third embodiment.
Figure 3B:
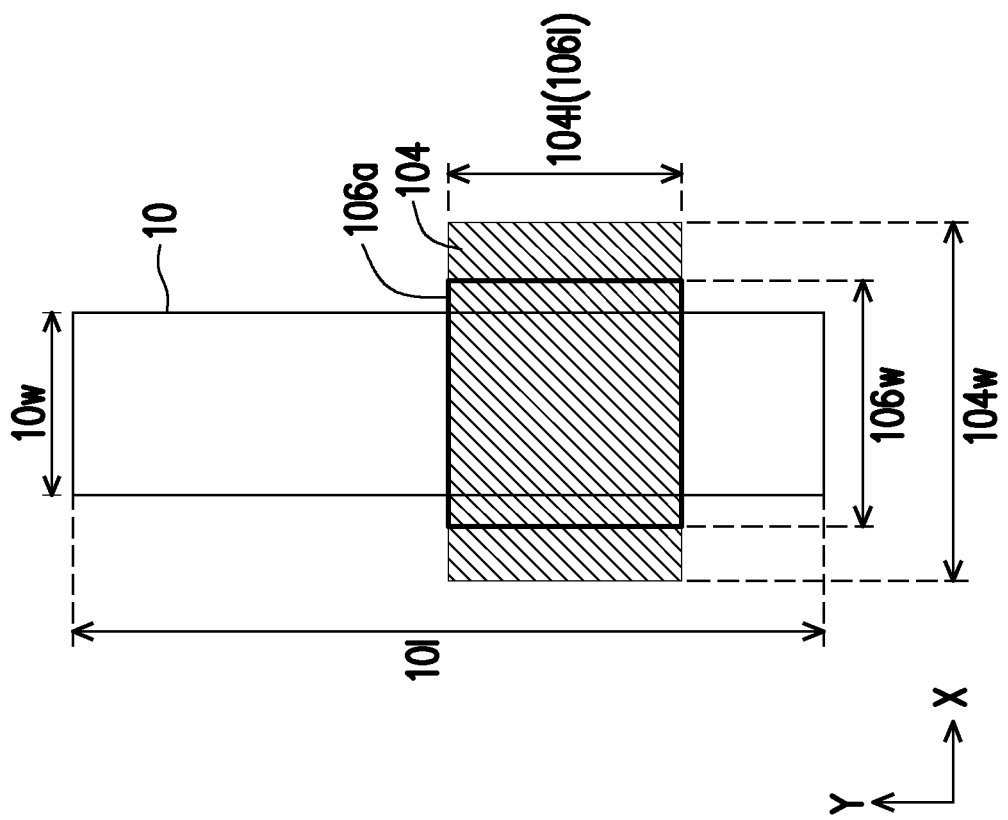
FIG. 3B is a top view along a cross-section I-I of FIG. 3A.

FIG. 3A is a cross-sectional view of an integrated circuit (IC) 300 having a capacitor structure 120 overlying a photodetector 103 in accordance with a third embodiment. FIG. 3B is a top view along a cross-section I-I of FIG. 3A.

Referring to FIG. 3A, the IC 300 may include the substrate 101 and an interconnect structure 150 on the substrate 101. In detail, the substrate 101 may have a pixel region 101a neighboring a logic region 101b. The pixel region 101a includes a photodetector 103 disposed in the substrate 101. In some embodiments, the substrate 101 may include a bulk silicon substrate and/or may include a first doping type (e.g., p-type). The photodetector 103 is configured to convert incident electromagnetic radiation (e.g. light) into an electrical signal. The photodetector 103 includes a second doping type (e.g., n-type) opposite the first doping type. In the embodiment, the photodetector 103 is a photodiode in the substrate 101.

The interconnect structure 150 may overlay the substrate 101 and may be configured to electrically couple devices (e.g., transistors, the photodetector 103, the capacitor structure 120, etc.) to one another. Specifically, the interconnect structure 150 may include a plurality of dielectric layers 152 (e.g., 152a, 152b, 152c, 152d, 152e), and a plurality of etching stop layers 154 (e.g., 154a, 154b), a plurality of conductive lines 156 (e.g., 156a, 156b), and a plurality of conductive vias 158 (e.g., 158a, 158b). The etching stop layers 154 are respectively disposed between the dielectric layers 152. The conductive lines 156 are arranged in the dielectric layers 152 and the etching stop layers 154. The conductive vias 158 are connected to two of the conductive lines 156. In some embodiments, the dielectric layer 152a may be referred to as an interlayer dielectric (ILD) layer, and the dielectric layers 152b, 152c, 152d, 152e may be referred to as an intermetal dielectric (IMD) layer. The interconnect structure 150 further includes the conductive layer 104 and the barrier layer 106a. The conductive layer 104 may be disposed on the dielectric layer 152a and embedded in the dielectric layer 152b (corresponding to the dielectric layer 102 in FIG. 1F). In the embodiment, the conductive layer 104 and the conductive line 156a are at substantially the same level, such as metal n−1 (Mn−1). Herein, when elements are described as "at substantially the same level", the elements are formed at substantially the same height in the same layer, or having the same positions embedded by the same layer. In some embodiments, the elements at substantially the same level are formed from the same material(s) with the same process step(s). In some embodiments, the tops of the elements at substantially the same level are substantially coplanar. For example, as shown in FIG. 3A, the conductive layer 104 and the conductive line 156a has the same height in the same dielectric layer 152b. The barrier layer 106a is disposed on the conductive layer 104. In addition, the etching stop layer 154a (corresponding to the etching stop layer 108 in FIG. 1F) overlying the top surface of the dielectric layer 152b and extending to cover a portion of the top surface of the conductive layer 104, the sidewall and a portion of the top surface of the barrier layer 106a. A composite layer constituted by the dielectric layer 152c and the etching stop layer 154a includes opposing sidewalls 151 that form the trench 10, and the capacitor structure 120 is disposed within the trench 10. In this case, the etching stop layer 154a is in physical contact with a lower sidewall of the capacitor structure 120. The lower electrode 122 is in physical contact with the opposing sidewalls 151 of the composite layer constituted by the dielectric layer 152c and the etching stop layer 154a (i.e., the sidewall of the trench 10). As shown in FIG. 3A, the interconnect structure 150 further includes the conductive feature 130 disposed on and electrically coupled to the lower electrode 122 of the capacitor structure 120. In the embodiment, the conductive feature 130 and the conductive line 156b are at substantially the same level, such as metal n (Mn). That is, the top surface of the conductive feature 130 and the top surface of the conductive line 156b are substantially coplanar.

Referring to FIG. 3B, the trench 10 may have a width 10w in a X direction and a length 101 in a Y direction. In some embodiments, the length 101 is greater than the width 10w. In some alternative embodiments, the length 101 may be equal to or less than the width 10w. The conductive layer 104 may have a width 104w in the X direction and a length 1041 in the Y direction, and the barrier layer 106a may have a width 106w in the X direction and a length 1061 in the Y direction. As shown in FIG. 3B, the width 106w of the barrier layer 106a is across the width 10w of the trench 10 (i.e., the width 106w is greater than the width 10w), and the width 104w of the conductive layer 104 is across the width 106w of the barrier layer 106a (i.e., the width 104w is greater than the width 106w). In this case, a contact area between the barrier layer 106a and the conductive layer 104 is greater than a contact area between the barrier layer 106a and the capacitor structure 120 within the trench 10. In some alternative embodiments, the width 104w of the conductive layer 104 may be equal to the width 106w of the barrier layer 106a.

Referring back to FIG. 3B, the logic region 101b is disposed laterally adjacent to the pixel region 101a. The logic region 101b includes semiconductor device(s), such as a transistor 140. The transistor 140 is disposed on the substrate 101. In some embodiments, the transistor 140 includes source/drain regions 142, a gate structure 145, and a spacer 148. The gate structure 145 may include a gate dielectric layer 144 and a gate electrode 146 on the gate dielectric layer 144. The transistor 140 may be electrically coupled to the conductive via (or contact) 158a, the conductive line 156a, the conductive via 158b, and the conductive line 156b in the interconnect structure 150. In some embodiments, the capacitor structure 120 may be electrically coupled to the photodetector 103 and/or transistor 140. In this case, the capacitor structure 120 may act as a decoupling capacitor to reduce the noise and the coupling interference of the IC 300.

Figure 4A:
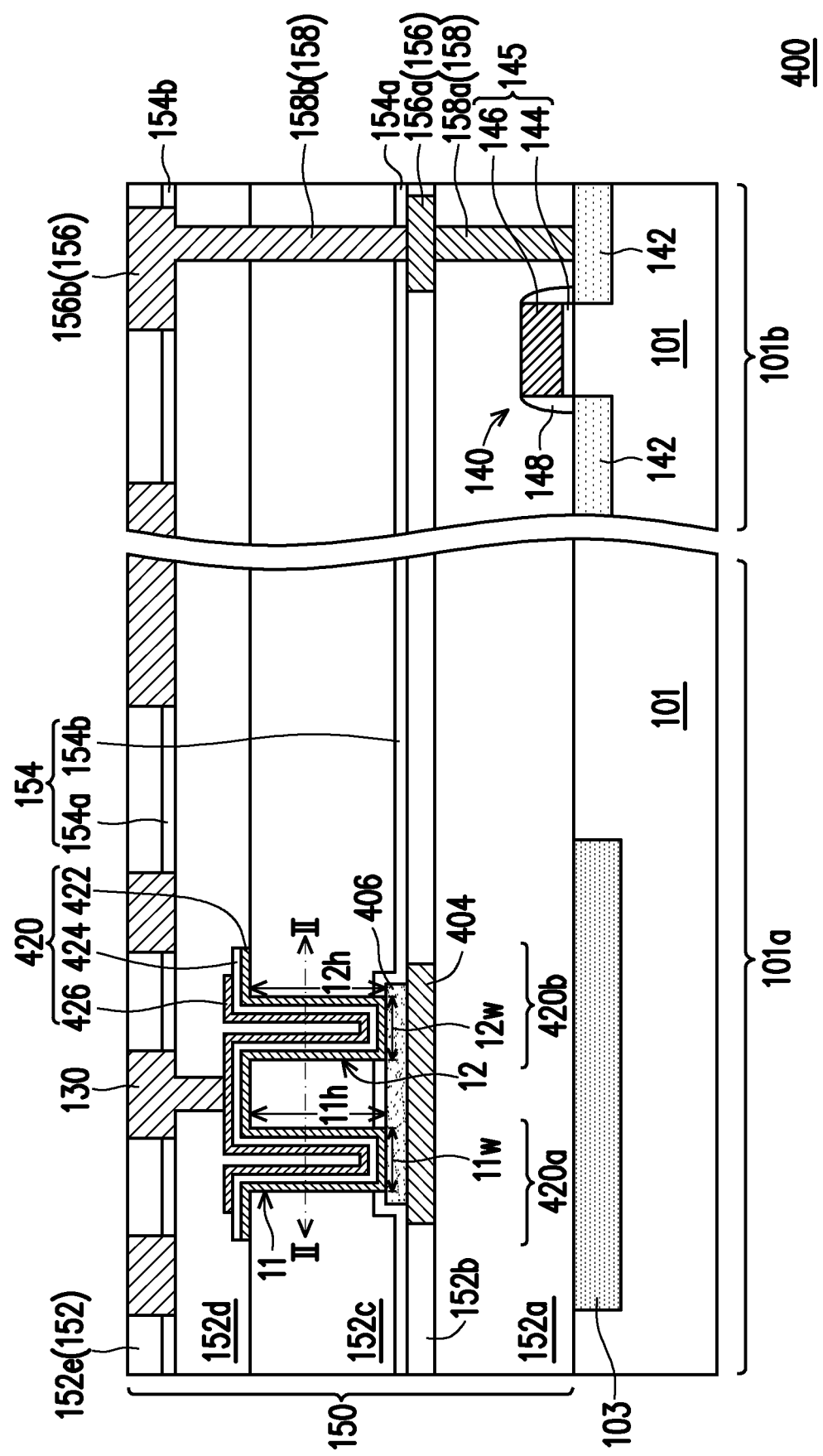
FIG. 4A is a cross-sectional view of an integrated circuit (IC) having a capacitor structure overlying a photodetector in accordance with a fourth embodiment.
Figure 4B:
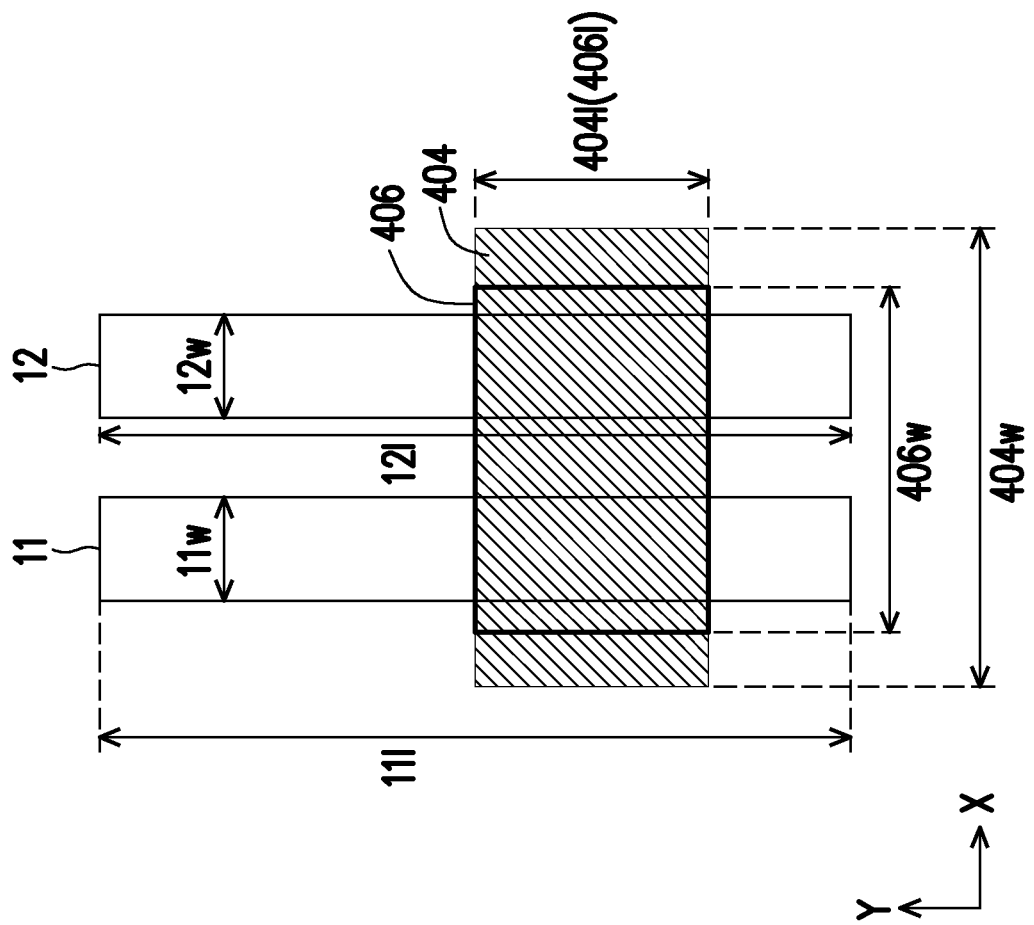
FIG. 4B is a plane view along a cross-section II-II of FIG. 4A.

FIG. 4A is a cross-sectional view of an integrated circuit (IC) 400 having a capacitor structure 420 overlying a photodetector 103 in accordance with a fourth embodiment. FIG. 4B is a plane view along a cross-section II-II of FIG. 4A.

Referring to FIG. 4A, the IC 400 is similar to the IC 300 of FIG. 3, but the capacitor structure 420 of FIG. 4A includes a first capacitor region 420a within a first trench 11 and a second capacitor region 420b within a second trench 12. Specifically, the first trench 11 and the second trench 12 may be disposed on a same barrier layer 406 on a same conductive layer 404. The first trench 11 may be laterally offset from and the second trench 12 by a non-zero distance. A lower electrode 422 of the capacitor structure 420 continuously extends from a surface of the first trench 11 to cover a surface of the second trench 12. The capacitor structure 420 further includes an upper electrode 426 and a capacitor dielectric layer 424. The upper electrode 426 may be disposed on the lower electrode 422 and continuously lining the surfaces of the first and second trenches 11 and 12. The capacitor dielectric layer 424 is disposed between the lower electrode 422 and the upper electrode 426 to separate the lower electrode 422 from the upper electrode 426. The conductive feature 130 is disposed on the upper electrode 426 between the first trench 11 and the second trench 12. That is, the conductive feature 130 is laterally offset from the first and second trenches 11 and 12 by a non-zero distance.

In some embodiments, the first trench 11 has a width 11w and a height 11h, the width 11w of the first trench 11 may be 0.10 μm to 0.15 μm, such as 0.12 μm; the height 11h of the first trench 11 may be 1.0 μm to 2.0 μm, such as 1.65 μm; and an aspect ratio of the first trench 11 (i.e., 11h/11w) may be 6.67 to 20, such as 13.75. In addition, the second trench 12 has a width 12w and a height 12h, the width 12w of the second trench 12 may be 0.10 μm to 0.15 μm, such as 0.12 μm; the height 12h of the second trench 12 may be 1.0 μm to 2.0 μm, such as 1.65 μm; and an aspect ratio of the second trench 12 (i.e., 12h/12w) may be 6.67 to 20, such as 13.75. In the embodiment, as the number of trenches in the IC 400 is double that of the IC 300, the capacitance of the capacitor structure in the IC 400 also increases (i.e. double). However, the embodiments of the present disclosure are not limited thereto. In other embodiments, three trenches, four trenches, or more trenches are included in the scope of the embodiment, thereby further increasing capacitance of the capacitor structure in the IC.

Referring to FIG. 4B, the first trench 11 may have the width 11w in the X direction and a length 111 in the Y direction, and the second trench 12 may have the width 12w in the X direction and a length 121 in the Y direction. In some embodiments, the length 111 is greater than the width 11w, and the length 121 is greater than the width 12w. The conductive layer 404 may have a width 404w in the X direction and a length 4041 in the Y direction, and the barrier layer 406 may have a width 406w in the X direction and a length 4061 in the Y direction. As shown in FIG. 4B, the width 406w of the barrier layer 406 is across the width 11w of the first trench 11 and the width 12w of the second trench 12. That is, the width 406w is greater than a sum of the width 11w and the width 12w. The width 404w of the conductive layer 404 is across the width 406w of the barrier layer 406 (i.e., the width 404w is greater than the width 406w). In this case, a contact area between the barrier layer 406 and the conductive layer 404 is greater than a contact area between the barrier layer 406 and the capacitor structure 420 within the first and second trenches 11 and 12. In some alternative embodiments, the width 404w of the conductive layer 404 may be equal to the width 406w of the barrier layer 406.

Figure 5:
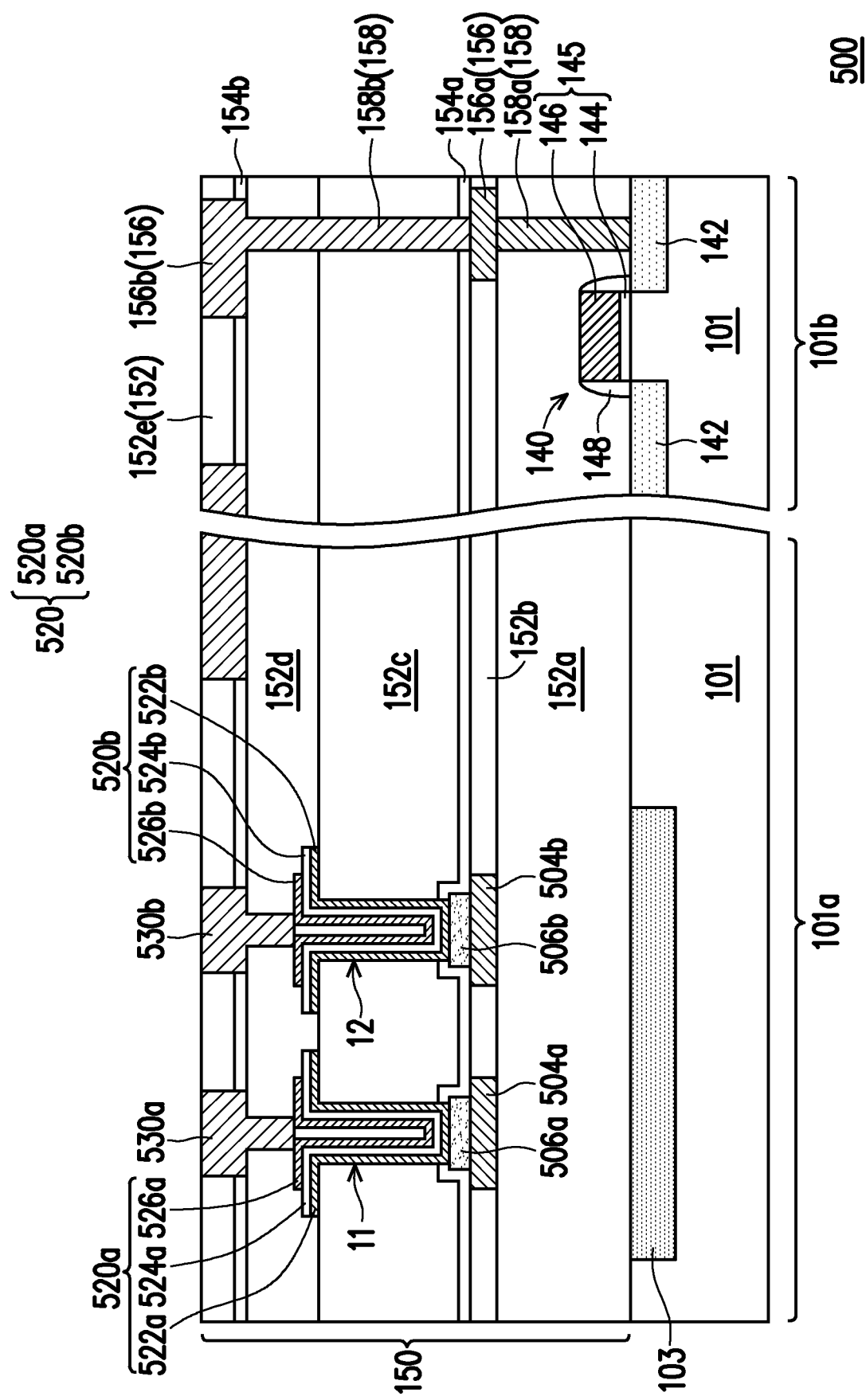
FIG. 5 is a cross-sectional view of an integrated circuit (IC) having a capacitor structure overlying a photodetector in accordance with a fifth embodiment.

FIG. 5 is a cross-sectional view of an integrated circuit (IC) 500 having a capacitor structure 520 overlying a photodetector 103 in accordance with a fifth embodiment.

Referring to FIG. 5, the IC 500 is similar to the IC 400 of FIG. 4A, but the capacitor structure 520 is divided into two capacitors 520a and 520b. Specifically, a first capacitor 520a is formed within the first trench 11 and connect a barrier layer 506a on a conductive layer 504a and a conductive feature 530a. The first capacitor 520a may include a lower electrode 522a, an upper electrode 526a, and a capacitor dielectric layer 524a between the lower electrode 522a and the upper electrode 526a. Similarly, a second capacitor 520b is formed within the second trench 12 and connect a barrier layer 506b on a conductive layer 504b and a conductive feature 530b. The second capacitor 520b may include a lower electrode 522b, an upper electrode 526b, and a capacitor dielectric layer 524b between the lower electrode 522b and the upper electrode 526b. The first capacitor 520a and the second capacitor 520b are separated to each other by a portion of the dielectric layer 152d and a portion of the dielectric layer 152c therebetween. In the embodiment, the first capacitor 520a and the second capacitor 520b are electrically connected to different conductive layers 504a/504b and different conductive features 530a/530b, thereby increasing the flexibility of the interconnect routing.

Figure 6:
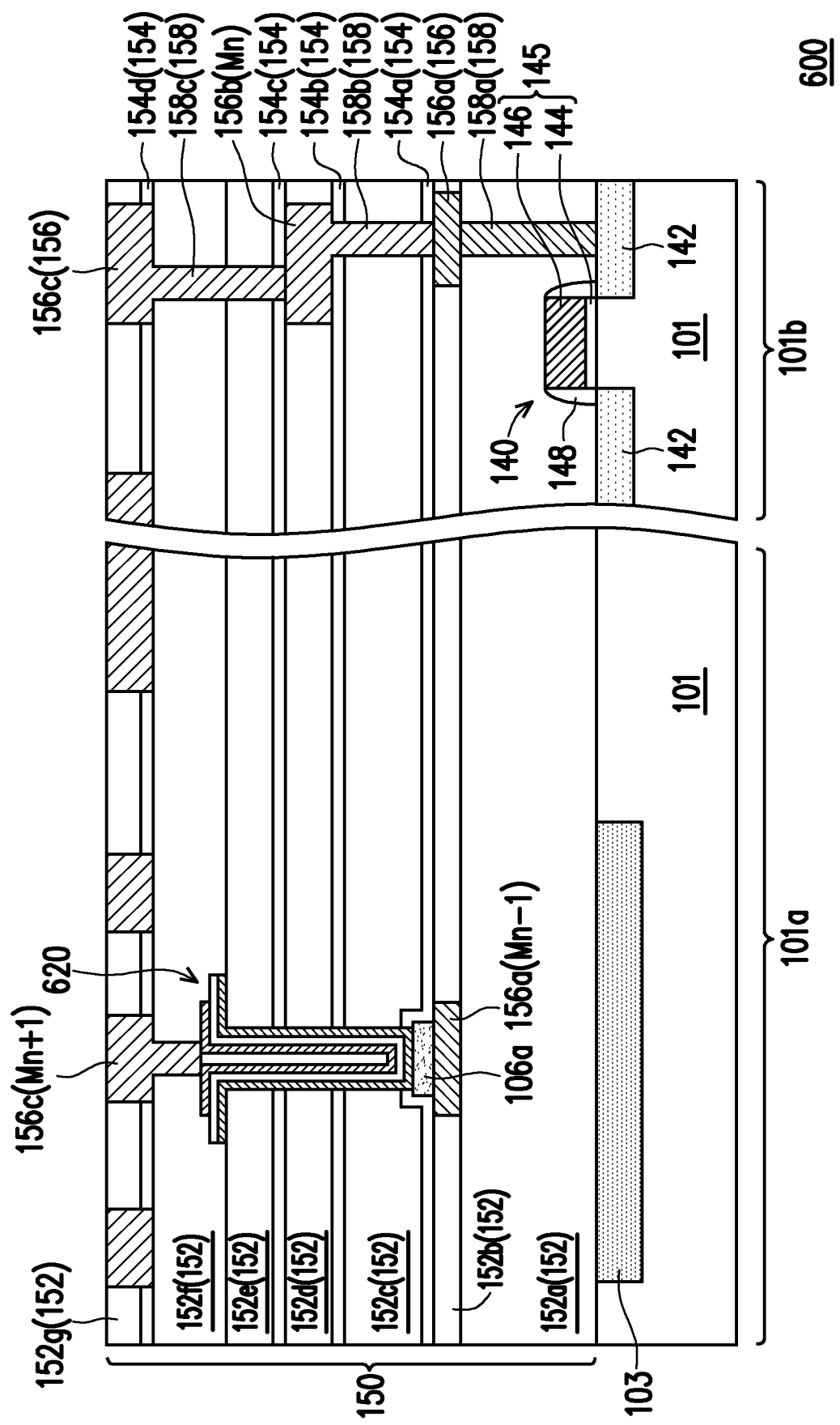
FIG. 6 is a cross-sectional view of an integrated circuit (IC) having a capacitor structure overlying a photodetector in accordance with a sixth embodiment.

FIG. 6 is a cross-sectional view of an integrated circuit (IC) 600 having a capacitor structure 620 overlying a photodetector 103 in accordance with a sixth embodiment.

Referring to FIG. 6, the interconnect structure 150 includes a plurality of dielectric layers 152 (e.g., 152a, 152b, 152c, 152d, 152e, 152f, 152g), a plurality of etching stop layers 154 (e.g., 154a, 154b, 154c, 154d), a plurality of conductive lines 156 (e.g., 156a, 156b, 156c), and a plurality of conductive vias 158 (e.g., 158a, 158b). The etching stop layers 154 are respectively disposed between the dielectric layers 152. The conductive lines 156 are arranged in the dielectric layers 152 and the etching stop layers 154. The conductive vias 158 are connected to two of the conductive lines 156. It should be noted that the capacitor structure 620 may penetrate through the dielectric layers 152c, 152d, and 152e, and the etching stop layers 154b and 154c, so as to connect the lower conductive lines 156a (e.g., metal n−1

(Mn−1)) and the upper conductive lines 156c (e.g., metal n+1 (Mn+1)). In other words, the capacitor structure 620 may span at least one level of the metal in the interconnect structure 150 in the vertical direction, such as the middle conductive lines 156b (e.g., metal n (Mn)).

In some embodiments, a height of the capacitor structure 620 of FIG. 6 is greater than a height of the capacitor structure 120 of FIG. 3A. In such embodiments, by virtue of the greater height of the capacitor structure 620, an area between the lower electrode and the upper electrode of the capacitor structure 620 may be increased. This may increase the capacitance of the capacitor structure 620 of FIG. 6.

Further, although only one capacitor structure 620 within one deep trench is illustrated in FIG. 6, the embodiments of the present disclosure are not limited thereto. In other embodiments, the number of the deep trench is adjusted by the need. That is, the capacitor structure within two deep trenches (e.g., the capacitor structure 520/620), three deep trenches, or more deep trenches is included in the scope of the embodiment, so as to increase the capacitance of the capacitor structure in the IC.

FIG. 7A to FIG. 7D are cross-sectional views of a method of forming a semiconductor structure having a capacitor structure between a first substrate and a second substrate in accordance with some embodiments.

Figure 7A:
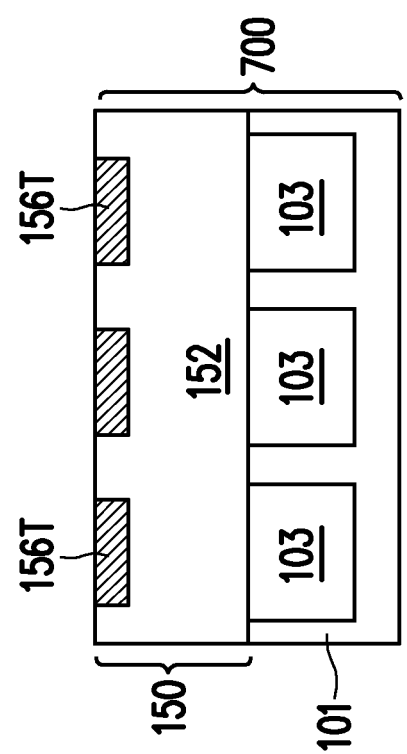
FIG. 7A to FIG. 7D are cross-sectional views of a method of forming a semiconductor structure having a capacitor structure between a first substrate and a second substrate in accordance with some embodiments.

Referring to FIG. 7A, an IC 700 is provided. The IC 700 may be one of the ICs 300, 400, 500, 600 having at least one capacitor structure 120, 420, 520, or 620 in the interconnect structure 150. The configurations, materials, and functions of the ICs 300, 400, 500, 600 are illustrated in the previous embodiments, and thus the details are omitted herein. For clarity, only top conductive features or top conductive lines 156T are illustrated in the interconnect structure 150 of FIG. 7A, while other components, such as dielectric layers, etching stop layers, conductive lines, conductive vias, and capacitor structures are omitted in FIG. 7A.

In some embodiments, the IC 700 may be a wafer including a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), the like, or combinations thereof.

Figure 7B:
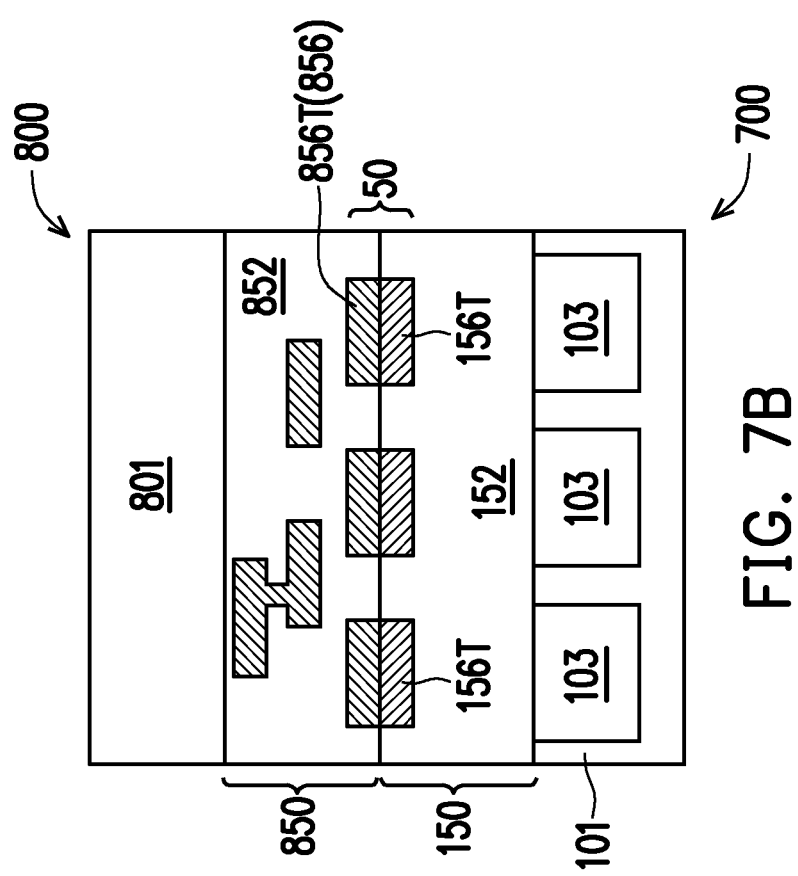

Referring to FIG. 7B, another IC 800 is provided to bond onto the IC 700. In some embodiments, the IC 800 may be a wafer including a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), the like, or combinations thereof. In the embodiment, the IC 800 is different from the IC 700. For example, the IC 700 may be a SoC wafer and the IC 800 may be an ASIC wafer.

Specifically, the IC 800 may include a substrate 801 and an interconnect structure 850 over the substrate 801. In some embodiments, the substrate 801 may be a semiconductor substrate, such as a bulk semiconductor, a semiconductor-on-insulator (SOI) substrate, or the like, which may be doped (e.g., with a p-type or an n-type dopant) or undoped. Generally, the SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. For example, the substrate 801 is a wafer, such as a silicon wafer. The substrate 801 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Alternatively, a plurality of electrical components, such as photodetectors, transistors, resistors, capacitors, inductors, diodes, or the like, may formed in a device region of the substrate 801 in the front-end-of-line (FEOL) processing of semiconductor manufacturing. In some embodiments, the electrical components may be formed in/on the substrate 801 using any suitable formation method known or used in semiconductor manufacturing.

In some embodiments, the interconnect structure 850 includes an interlayer dielectric (ILD) layer 852 and a plurality of conductive feature including conductive lines 856 and conductive vias (not shown). The ILD layer 852 includes a plurality of dielectric layers. The conductive features are arranged in the dielectric layers. For clarity, the top conductive line exposed by the ILD layer 852 are labeled as "856T".

As shown in FIG. 7B, the IC 800 is further turned upside down and mounted onto the IC 700. In detail, the IC 700 and the IC 800 are face-to-face bonded together via the interconnect structure 150 and the interconnect structure 850. In some embodiments, before the IC 800 is bonded to the IC 700, the interconnect structure 150 and the interconnect structure 850 are aligned, so that the top conductive line 156T may be bonded to the top conductive line 856T. In some embodiments, the alignment of the top conductive line 156T and the top conductive line 856T may be achieved by using an optical sensing method. After the alignment is achieved, the interconnect structure 150 and the interconnect structure 850 are bonded together by a hybrid bonding process to form a hybrid bonding structure 50.

In some embodiments, the interconnect structure 150 and the interconnect structure 850 are hybrid bonded together by the application of pressure and heat. It is noted that the hybrid bonding process involves at least two types of bonding process, including metal-to-metal bonding and non-metal-to-non-metal bonding such as dielectric-to-dielectric bonding or fusion bonding. As shown in FIG. 7B, the hybrid bonding structure 50 includes the top conductive line 156T and the top conductive line 856T bonded by metal-to-metal bonding, and the dielectric layer 152 and the dielectric layer 852 bonded by non-metal-to-non-metal bonding.

Figure 7C:
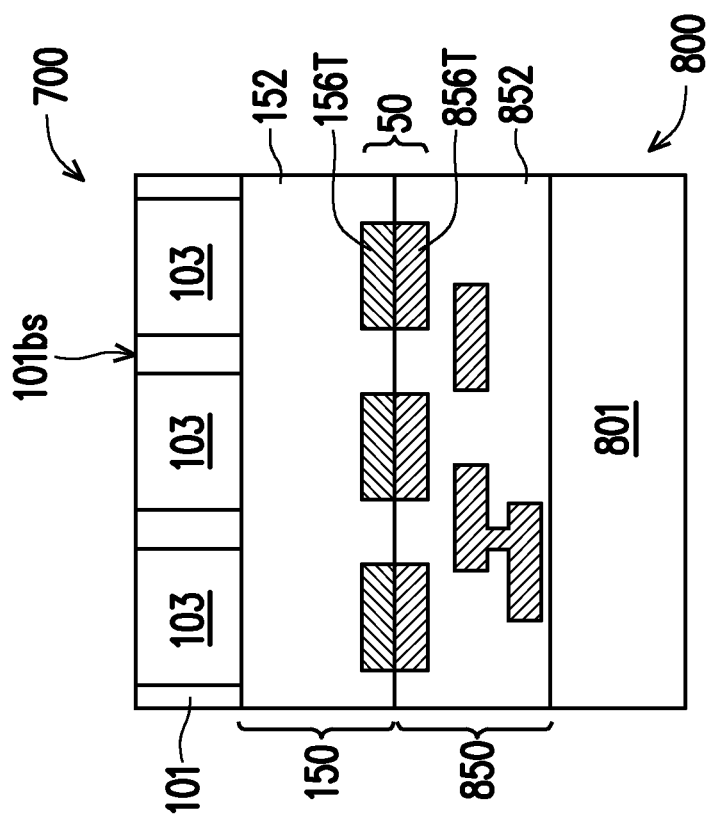

Referring to FIG. 7C, after performing the hybrid bonding process, a backside 101bs of the substrate 101 of the IC 700 is thinned or grinded until the photodetectors 103 are exposed or almost exposed. In some alternative embodiments, doped regions and/or a negatively-charged film are formed on the photodetectors 103 to repair defects formed during the thinning of the substrate 101.

Figure 7D:
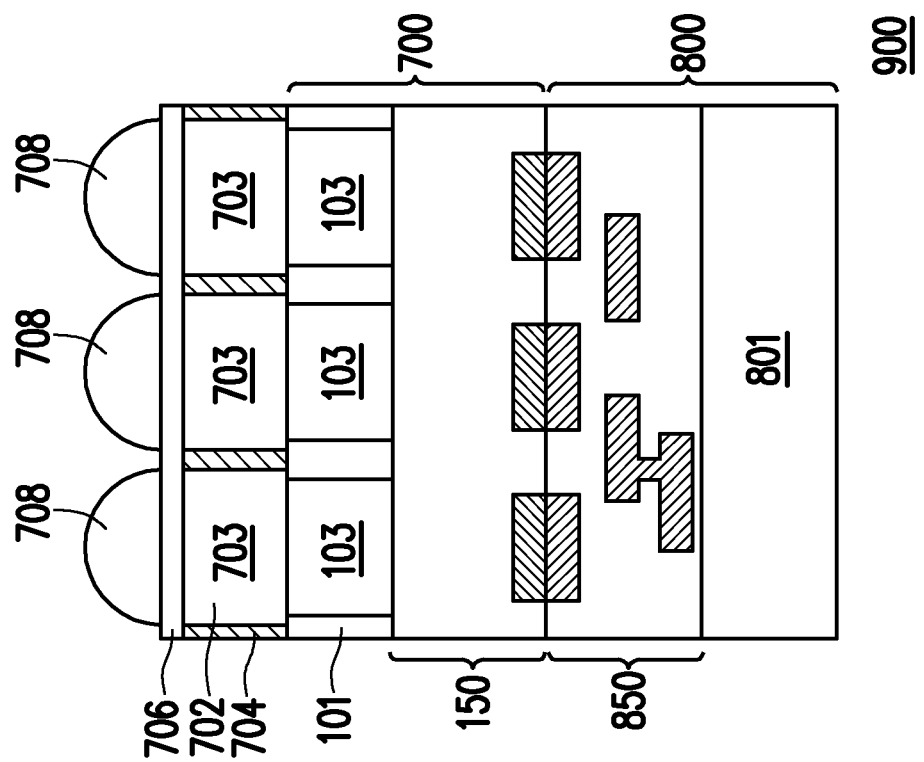

Referring to FIG. 7D, some optical elements are then formed on the photodetectors 103 to guide light into the photodetectors 103, in accordance with some embodiments. In particular, a dielectric layer 702 may be formed over the backside 101bs of the substrate 101. A reflective grid 704 is formed in the dielectric layer 702 to divide the dielectric layer 702 into a plurality of interior regions 703. The reflective grid 704 may laterally surround the interior regions 703, so that the interior regions 703 are configured in the form of a rectangle, a square, or other designed shapes according to the need. The interior regions 703 may correspond to the underlying photodetectors 103. That is, the reflective grid 704 may laterally surround the photodetectors 103 in a top view. In some embodiments, the reflective grid 704 may be metal grid that is used to reflect light into the photodetectors 103. Alternatively, the reflective grid 704 may be a composite grid including a metal grid and a low-n grid overlaying the metal grid. The low-n grid has a "low" refractive index relative to the dielectric layer 702 to promote total internal reflection and hence to prevent radiation from passing between adjacent interior regions 703.

After forming the reflective grid 704, a color filter film 706 is then formed on the dielectric layer 702 and the reflective grid 704. In some embodiments, the color filter film 706 extends to cover the reflective grid 704 and the interior regions 703 surrounded by the reflective grid 704. Thereafter, plurality of microlenses 708 are formed over the color filter film 706. As shown in FIG. 7D, the microlenses 708 respectively correspond the underlying photodetectors 103. In some embodiments, the microlenses 708 are configured to focus incident radiation (e.g., light) towards the photodetectors 103. For example, the microlenses 708 may have convex upper surfaces configured to focus radiation towards the photodetectors 103.

Figure 8:
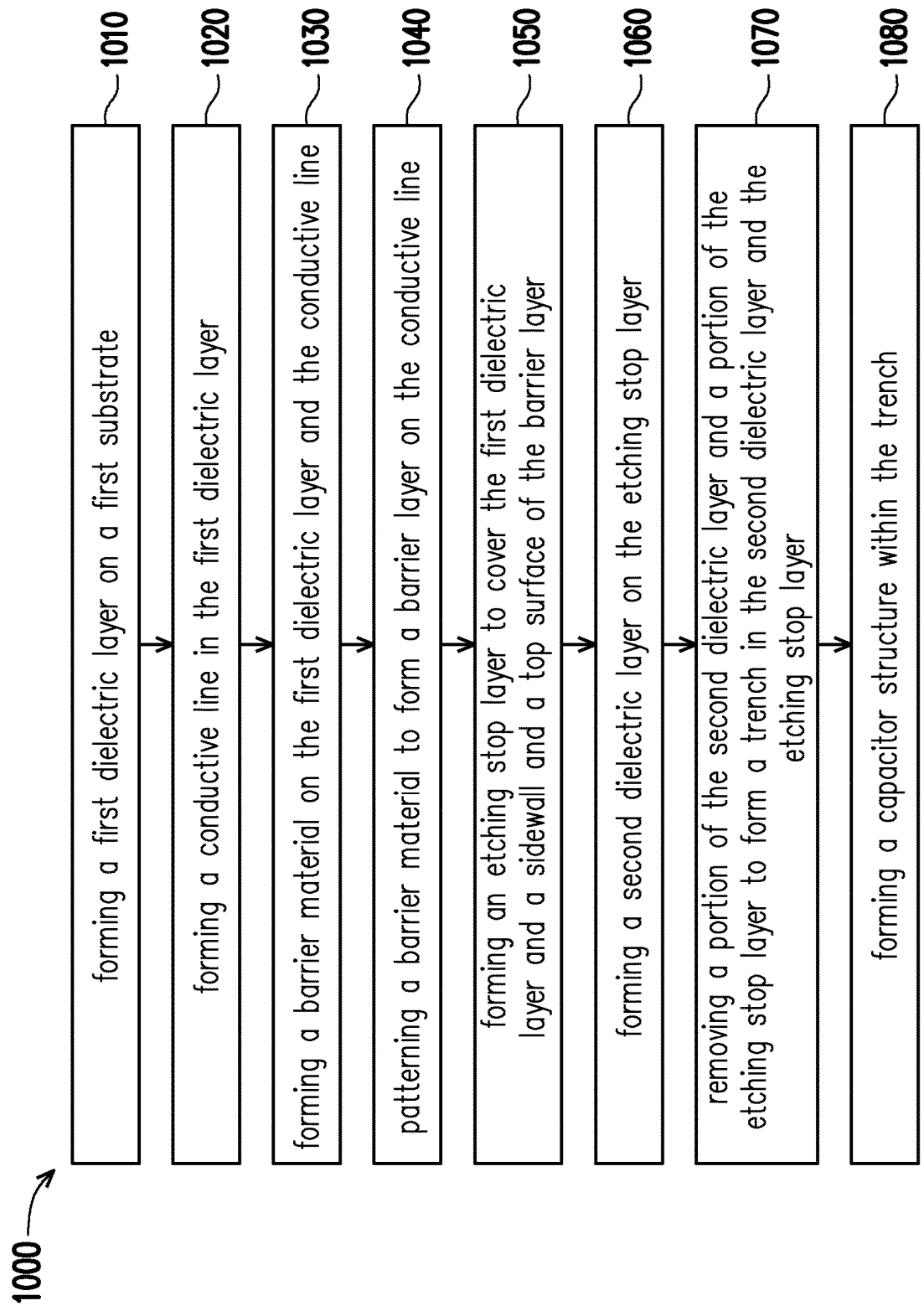
FIG. 8 illustrates a flowchart of a method for forming an integrated circuit (IC) having a capacitor structure in accordance with some embodiments.

FIG. 8 illustrates a flow chart 1000 of a method of forming an IC having a capacitor structure in accordance with some embodiments. While disclosed method 1000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. FIG. 8 may illustrate some embodiments of the method disclosed by FIG. 1A to FIG. 1E.

Referring to FIG. 8, at block 1010, a first dielectric layer is formed on a first substrate. FIG. 1A illustrates the cross-sectional view corresponding to some embodiments corresponding to block 1010.

Referring to FIG. 8, at block 1020, a conductive line is formed in the first dielectric layer. FIG. 1A illustrates the cross-sectional view corresponding to some embodiments corresponding to block 1020.

Referring to FIG. 8, at block 1030, a barrier material is formed on the first dielectric layer and the conductive line. FIG. 1A illustrates the cross-sectional view corresponding to some embodiments corresponding to block 1030.

Referring to FIG. 8, at block 1040, a barrier material is patterned to form a barrier layer on the conductive line. FIG. 1B illustrates the cross-sectional view corresponding to some embodiments corresponding to block 1040.

Referring to FIG. 8, at block 1050, an etching stop layer is formed to cover the first dielectric layer and a sidewall and a top surface of the barrier layer. Next, at block 1060, a second dielectric layer is formed on the etching stop layer. Thereafter, at block 1070, a portion of the second dielectric layer and a portion of the etching stop layer are etched to form a trench in the second dielectric layer and the etching stop layer, wherein the trench exposes a portion of the top surface of the barrier layer. FIG. 1C illustrates the cross-sectional view corresponding to some embodiments corresponding to block 1050 to block 1070.

Referring to FIG. 8, at block 1080, a capacitor structure is formed within the trench. FIG. 1D and FIG. 1E illustrate the cross-sectional views corresponding to some embodiments corresponding to block 1080.

In accordance with an embodiment, an integrated circuit (IC) includes a substrate; a conductive layer, disposed on the substrate; a barrier layer, disposed on the conductive layer; an etching stop layer, covering a sidewall of the barrier layer and extending on a first portion of a top surface of the barrier layer; and at least one capacitor structure, disposed on a second portion of the top surface of the barrier layer.

In accordance with an embodiment, a semiconductor structure includes a first substrate; a photodetector disposed in the first substrate; an interconnect structure disposed on the first substrate; and a first capacitor. The interconnect structure includes an interlayer dielectric layer, comprising opposing first sidewalls that at least partially define a first trench overlying the photodetector; a lower conductive line, embedded in the interlayer dielectric layer, and disposed between the photodetector and the first trench; and a barrier layer, disposed between the lower conductive line and the first trench, wherein a portion of a top surface of the barrier layer is exposed by the first trench. The first capacitor is disposed within the first trench to contact the portion of the top surface of the barrier layer exposed by the first trench.

In accordance with an embodiment, a method of forming a semiconductor structure includes: forming a first dielectric layer on a first substrate; forming a conductive line in the first dielectric layer; forming a barrier material on the first dielectric layer and the conductive line; patterning a barrier material to form a barrier layer on the conductive line; forming an etching stop layer to cover the first dielectric layer and a sidewall and a top surface of the barrier layer; forming a second dielectric layer on the etching stop layer; removing a portion of the second dielectric layer and a portion of the etching stop layer to form a trench in the second dielectric layer and the etching stop layer, wherein the trench exposes a portion of the top surface of the barrier layer; and forming a capacitor structure within the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
   a substrate;
   a conductive layer, disposed on the substrate;
   a barrier layer, disposed on the conductive layer, wherein a first portion of a top surface of the conductive layer is covered by the barrier layer, and a second portion of the top surface of the conductive layer is exposed by the barrier layer;
   an etching stop layer, covering a sidewall of the barrier layer and extending on a first portion of a top surface of the barrier layer; and
   at least one capacitor structure, disposed on a second portion of the top surface of the barrier layer.

2. The IC of claim 1, wherein the etching stop layer is in physical contact with a lower sidewall of the at least one capacitor structure.

3. The IC of claim 1, further comprising:
   a first dielectric layer, laterally surrounding the conductive layer, wherein the etching stop layer covers a top surface of the first dielectric layer and the second portion of the top surface of the conductive layer; and
   a second dielectric layer, disposed on the etching stop layer, so that the etching stop layer is disposed between the first and second dielectric layers, wherein a composite layer constituted by the second dielectric layer and the etching stop layer comprises opposing sidewalls that define at least one trench, and the at least one capacitor structure is disposed within the at least one trench.

4. The IC of claim 3, wherein the at least one capacitor structure comprises:
   a lower electrode, lining a surface of the at least one trench, and electrically connected to the conductive layer by contacting the second portion of the top surface of the barrier layer;
   an upper electrode, disposed over the lower electrode; and
   a capacitor dielectric layer, disposed between the lower electrode and the upper electrode to separate the lower electrode from the upper electrode.

5. The IC of claim 4, wherein the lower electrode is in physical contact with the opposing sidewalls of the composite layer constituted by the second dielectric layer and the etching stop layer.

6. The IC of claim 1, wherein a contact area between the barrier layer and the conductive layer is greater than a contact area between the barrier layer and the at least one capacitor structure.

7. The IC of claim 3, wherein the at least one capacitor structure comprises:
   a first capacitor region, disposed within a first trench defined by opposing first sidewalls of the composite layer constituted by the second dielectric layer and the etching stop layer; and
   a second capacitor region, disposed within a second trench defined by opposing second sidewalls of the composite layer constituted by the second dielectric layer and the etching stop layer, wherein a lower electrode of the at least one capacitor structure continuously extends from a surface of the first trench to cover a surface of the second trench.

8. The IC of claim 1, wherein the substrate comprises a pixel region and a logic region, the at least one capacitor structure is disposed over the substrate in the pixel region, and a photodetector is further disposed in the substrate in the pixel region.

9. A semiconductor structure, comprising:
   a first substrate;
   a photodetector, disposed in the first substrate;
   an interconnect structure, disposed on the first substrate, wherein the interconnect structure comprises:
      an interlayer dielectric layer, comprising opposing first sidewalls that at least partially define a first trench overlying the photodetector;
      a lower conductive line, embedded in the interlayer dielectric layer, and disposed between the photodetector and the first trench; and
      a barrier layer, disposed between the lower conductive line and the first trench, wherein a portion of a top surface of the barrier layer is exposed by the first trench, wherein a first portion of a top surface of the lower conductive line is covered by the barrier layer, and a second portion of the top surface of the lower conductive line is exposed by the barrier layer; and
   a first capacitor, disposed within the first trench to contact the portion of the top surface of the barrier layer exposed by the first trench.

10. The semiconductor structure of claim 9, wherein the interconnect structure further comprises: an etching stop layer covering a sidewall of the barrier layer and extending on another portion of the top surface of the barrier layer that is uncovered by the first capacitor.

11. The semiconductor structure of claim 10, wherein the etching stop layer is in physical contact with a lower sidewall of the first capacitor.

12. The semiconductor structure of claim 9, wherein the interconnect structure comprises: an upper conductive line disposed on the first capacitor,
   wherein the interlayer dielectric layer comprises a plurality of dielectric layers, and a plurality of conductive lines are arranged in the plurality of dielectric layers,
   wherein the first capacitor penetrates through the plurality of dielectric layers to connect the upper conductive line and the lower conductive line.

13. The semiconductor structure of claim 9, wherein the first capacitor comprises:
   a lower electrode, disposed within the first trench, and electrically connected to the lower conductive line by contacting the portion of the top surface of the barrier layer;
   an upper electrode, disposed over the lower electrode; and
   a capacitor dielectric layer, disposed between the lower electrode and the upper electrode to separate the lower electrode from the upper electrode.

14. The semiconductor structure of claim 13, the lower electrode has a U-shaped profile within the first trench, and the upper electrode has a T-shaped profile.

15. The semiconductor structure of claim 9, wherein the interlayer dielectric layer further comprises opposing second sidewalls that at least partially define a second trench laterally offset from the first trench, wherein a second capacitor is disposed within the second trench.

16. The semiconductor structure of claim 9, further comprising:
   a second substrate, bonded to the first substrate, so that the interconnect structure is disposed between the first and second substrates;
   a metal grid, disposed on a backside of the first substrate, wherein the metal grid laterally surrounds the photodetector in a top view;
   a color filter film, disposed on the metal grid; and
   a microlens, disposed on the color filter film and corresponding the photodetector.

17. A method of forming a semiconductor structure, comprising:

forming a first dielectric layer on a first substrate;

forming a conductive layer in the first dielectric layer;

forming a barrier material on the first dielectric layer and the conductive layer;

patterning a barrier material to form a barrier layer on the conductive layer, wherein a first portion of a top surface of the conductive layer is covered by the barrier layer, and a second portion of the top surface of the conductive layer is exposed by the barrier layer;

forming an etching stop layer to cover the first dielectric layer and a sidewall and a top surface of the barrier layer;

forming a second dielectric layer on the etching stop layer;

removing a portion of the second dielectric layer and a portion of the etching stop layer to form a trench in the second dielectric layer and the etching stop layer, wherein the trench exposes a second portion of the top surface of the barrier layer, while the etching stop layer extends on a first portion of the top surface of the barrier layer; and forming a capacitor structure within the trench, so that the capacitor structure is disposed on the second portion of the top surface of the barrier layer.

18. The method of claim 17, wherein the forming the capacitor structure comprises:

forming a lower electrode material on the barrier, the lower electrode material overlying the second dielectric layer and lining a surface of the trench;

forming a capacitor dielectric material, the capacitor dielectric material overlying the lower electrode material and lining the surface of the trench;

forming an upper electrode material, the upper electrode material overlying the capacitor dielectric material and lining the surface of the trench; and patterning the upper electrode material to form an upper electrode, and patterning the capacitor dielectric material and the lower electrode material to form a capacitor dielectric layer and a lower electrode, wherein a length of the capacitor dielectric layer and the lower electrode extending on the second dielectric layer is greater than a length of the upper electrode extending on the second dielectric layer.

19. The method of claim 17, wherein the barrier layer has a bottom width greater than a width of the trench.

20. The method of claim 17, further comprising:

forming a photodetector in the first substrate before forming the first dielectric layer, wherein the photodetector corresponds the capacitor structure;

bonding a second substrate onto the first substrate after forming the capacitor structure, so that the capacitor structure is located between the second substrate and the first substrate;

thinning a backside of the first substrate to expose the photodetector;

forming a metal grid on a thinned backside of the first substrate;

forming a color filter film on the metal grid; and forming a microlens on the color filter film.

* * * * *